United States Patent [19]

Murakami

[11] Patent Number: 4,674,094

[45] Date of Patent: Jun. 16, 1987

[54] SEMICONDUCTOR LASER WITH AN ACTIVE LAYER HAVING VARYING THICKNESSES

[75] Inventor: Takashi Murakami, Itami, Japan

[73] Assignee: Mitsubishi Denki Kabushiki Kaisha, Tokyo, Japan

[21] Appl. No.: 699,442

[22] Filed: Feb. 7, 1985

[30] Foreign Application Priority Data

Mar. 12, 1984 [JP] Japan .................................. 59-48406

[51] Int. Cl.[4] ............................................ H01S 3/19
[52] U.S. Cl. ......................................... 372/45; 372/46
[58] Field of Search ....................... 372/45, 46; 357/17

[56] References Cited

U.S. PATENT DOCUMENTS

| | | | |
|---|---|---|---|
| 4,282,494 | 8/1981 | Yonezu et al. | 372/46 |
| 4,429,395 | 1/1984 | Olsen et al. | 372/45 |
| 4,608,695 | 8/1986 | Oda et al. | 372/46 |

FOREIGN PATENT DOCUMENTS

| | | | |
|---|---|---|---|
| 0095826 | 12/1983 | European Pat. Off. | 372/45 |
| 2112201A | 7/1983 | United Kingdom | 372/46 |

OTHER PUBLICATIONS

European Search Report Application No. EP 85 30 1612.
European Search Report Application No. EP 83 30 1600.
"Large Optical Cavity AlGaAs Buried Heterostructure Window Lasers" by H. Blauvelt, et al., Applied Physics Letters, vol. 40 (1982), pp. 1029-1031.
"High Optical Power Density Emission from a Window-Stripe AlGaAs Double-Heterostructure Laser", by Y. Yonezu et al., Applied Physics Letters, May 15, 1979, pp. 637-639.
"Monolithic High-Power Dual-Wavelength GaAlAs Laser Array", M. Wada et al., Applied Physics Letters, 11/15/83, pp. 903 to 905.
"A High-Power, Single-Mode Laser with Twin-Ridge-Substrate Structure", M. Wada et al., Applied Physics Letters, 5/15/83, pp. 853 to 854.
"Visible GaAlAs V-Channeled Substrate Inner Stripe Laser with Stabilized Mode Using p-GaAs Substrate", S. Yamamoto et al., Applied Physics Letters, 3/1/82, pp. 372 to 374.

Primary Examiner—James W. Davie
Attorney, Agent, or Firm—Birch, Stewart, Kolasch & Birch

[57] ABSTRACT

A semiconductor laser includes a semiconductor substrate of first conductivity type having a ridge extending in a direction substantially parallel to the direction of the light guide only in the neighborhood of the resonator end surface; a lower cladding layer of first conductivity type, an active layer, and an upper cladding layer of second conductivity type produced one after the other on the substrate in the above-mentioned order in such a manner that the portion of the active layer above the ridge is thinner than the portion of the active layer that is inside the laser resonator removed from the resonator and surface.

13 Claims, 6 Drawing Figures

SEMICONDUCTOR LASER WITH AN ACTIVE LAYER HAVING VARYING THICKNESSES

FIELD OF THE INVENTION

The present invention relates to a semiconductor laser, and more particularly to a laser that is capable of preventing heat-caused-laser mirror-destruction while obtaining a high power output.

BACKGROUND OF THE INVENTION

In order to explain the background of the invention, reference will be particularly made to FIG. 1. The reference numeral 1 designates a GaAs substrate. The numeral 2 designates a $Ga_{1-x}Al_xAs$ lower cladding layer, the numeral 3 designates a $Ga_{1-y}Al_yAs$ active layer, and the numeral 4 designates a $Ga_{1-x}Al_xAs$ upper cladding layer. The numeral 5 designates a GaAs contact layer, the numeral 6 designates a substrate electrode, the numeral 7 designates a stripe electrode, and the numeral 10 designates an end surface of the laser resonator. The bottom two layers, substrate 1 and the lower cladding layer 2, and the top two layers, upper cladding layer 4 and the contact layer 5, have mutually opposite conductivity types. That is, when the former two, 1 and 2, are n types, the latter two, 4 and 5 are p types, and vice versa. There is a relation that $x > y$ among the aluminium composition proportions x and y.

The operation of the device is described as follows:

When it is presumed that the substrate 1 is n type, the lower cladding layer 2 is n type, the upper cladding layer 4 and the contact layer 5 are p types, and the active layer 3 is of either of the two types. The three layers of the lower cladding layer 2, the active layer 3, and the upper cladding layer 4, where the aluminium composition proportion x is larger than y, constitute a double heterostructure, and under this structure the confinement of injected carriers and light are achieved, and it leads to a laser oscillation. The generated laser light is emitted from the light emitting portion 3a at the resonator end surface 10 which is the result of the cleavage.

This prior art semiconductor laser does not have a window structure at the light emitting end surface. In other words, the band gap of the active layer 3 in the neighborhood of the light emitting end surface 10 is equal to the band gap of the active layer inside the resonator, and therefore, most of the light generated at the active layer 3 is absorbed at the laser emitting end surface 3b of the active layer 3 where a lot of surface energy levels exist. This increases the likelihood that the laser emitting end surface 3b will be destroyed by heat produced by the absorption of light when the light output is increased. Aiming at overcoming the disadvantages described above, there are several attempts to develop a method of producing a semiconductor laser having a window structure. However, these methods have disadvantages in that they are difficult manufacturing methods and may produce astigmatism of the laser beam.

As another prior art of a semiconductor laser, there is an article, "Monolithic high-power dual-wavelength GaAlAs laser array" by M. Wada et al, Appl. Phys. Lett. 43(10) Nov. 15, 1983, p903 to p905. In this article it is described that the production of ridges or terraces on a substrate makes the growth velocities of portions on the ridges or terraces different, thereby resulting in variations of the composition proportion in AlAs of the portions.

Another prior art of a semiconductor laser is reported in an article, "A high-power, single-mode laser with twin-ridge-substrate structure" by M. Wada et al, Appl. Phys. Lett. 42(10), May 15, 1983 p853 to 854. In this article it is described that production of an active layer on a ridge of a substrate by a liquid phase growth method results in a low growth velocity, thereby enabling one to obtain a thin active layer easily.

Other prior art of a semiconductor laser is reported in an article, "Visible GaAlAs V-channeled substrate inner stripe laser with stabilized mode using p-GaAs substrate" by S. Yamamoto et al, Appl. Phys. Lett. 40(5), Mar. 1, 1982, p372 to p374. This article shows a transverse mode controlled semiconductor laser to which the present invention is applied to obtain a third embodiment.

OBJECTS AND SUMMARY OF THE INVENTION

The present invention is directed to solving the problems pointed out above, and has for its object to provide a semiconductor laser capable of outputting a high power laser light, without destruction of the light emitting end surface.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a semiconductor laser, which comprises: a semiconductor substrate of a first conductivity type having a ridge extending in a direction substantially parallel to the direction of the light guide and in the neighborhood of the resonator end surface of the laser resonator; a lower cladding layer of first conductivity type, an active layer, and an upper cladding layer of second conductivity type produced one after the other on the substrate in the above-mentioned order in such a manner that the portion of the active layer above the ridge is thinner than the portion of the active layer that is inside the laser resonator.

DETAILED DESCRIPTION OF THE PREFERRED EMBODIMENTS

Figure 1:
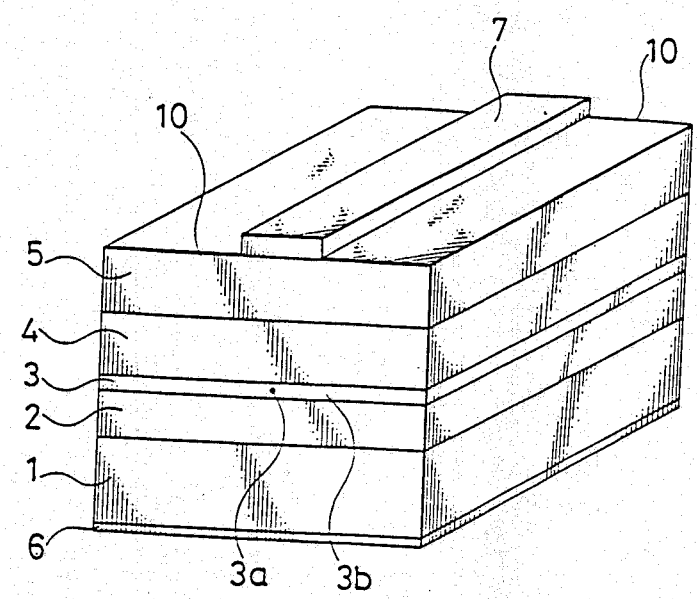
FIG. 1 shows a perspective view of a prior art semiconductor laser.
Figure 2:
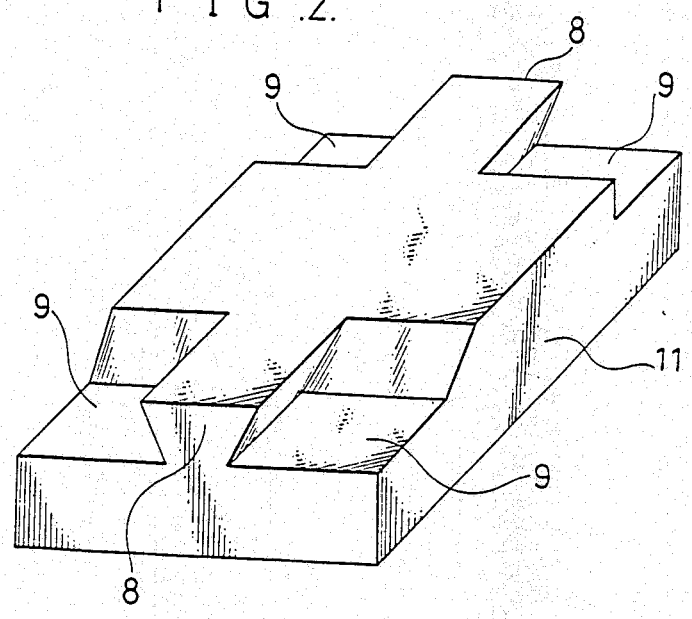
FIG. 2 shows a perspective view of a substrate which is used for producing a first embodiment of the present invention.

FIG. 2 shows a perspective view of a GaAs substrate which is used for producing a first embodiment of the present invention. The GaAs substrate 11 is provided with four grooves 9 which are produced by etching so as to produce ridges 8 which extend in a direction substantially parallel to the direction of the light guide. Each ridge has a cross section of an inverse mesa type configuration at the center of the width direction of the substrate in the neighborhood of the of the resonator end surface 10 of the laser chip. Herein, FIG. 2 shows the substrate 11 only for one chip of laser element. The width of the ridge 8 is typically set to about 10 μm, and the width of the substrate at the resonator end surface 10 of the laser chip is set to about 300 μm.

Figure 3:
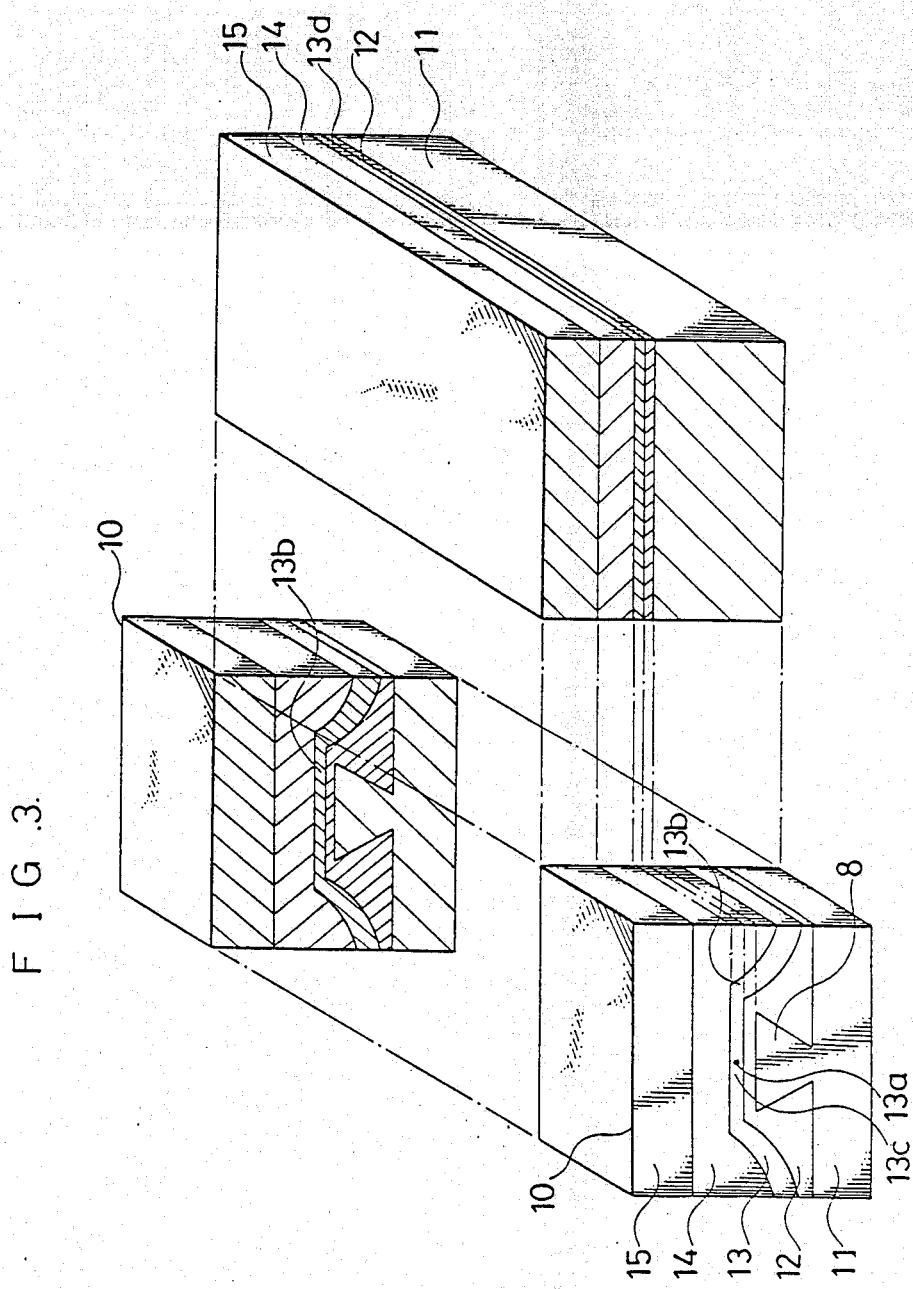
FIG. 3 shows a perspective view of a first embodiment of the present invention.

FIG. 3 shows a perspective view of a first embodiment of the present invention which is obtained by producing, by liquid phase growth, the required layers on the substrate 11 shown in FIG. 2. In FIG. 3 the central portion of the device is relocated so as to clarify the structure of the device. The reference numeral 12 designates a $Ga_{1-x}Al_xAs$ lower cladding layer. The numeral 13 designates a $Ga_{1-y}Al_yAs$ active layer, the numeral 13a designates a light emitting portion thereof, the numeral 13c designates a light emitting end surface thereof, the numeral 13b designates a portion of the active layer 13 in the neighborhood of the light emitting end surface 13c, and the numeral 13d designates a portion of the active layer 13 that is inside the resonator removed from the end surface. The numeral 14 designates a $Ga_{1-x}Al_xAs$ upper cladding layer.

When liquid phase growth of $Ga_{1-x}Al_xAs$ is conducted onto the substrate 11, the growth inside the chip where grooves are not provided proceeds in the same manner as in the conventional one, however in the neighborhood of the resonator end surface 10, a phenomenon which is unique to the liquid phase growth arises as in the following:

That is, in a liquid phase growth the growth velocity in the neighborhood of the side surface of the ridge 8 becomes faster than that in the usual growth process caused by anisotropy, and the growth velocity on the ridge 8 becomes slower than that in the usual growth process. Such a slow growth velocity onto the ridge 8 makes the layer on the ridge 8 in the neighborhood of the resonator end surface 10 thin, and also makes the aluminium composition proportion x of $Ga_{1-x}Al_xAs$ in the layer larger than that inside the chip. Accordingly, the band gap of the active layer 13b in the neighborhood of the resonator end surface 10 becomes larger than that of the band gap of the active layer 13d inside the chip, thereby constituting a window structure.

In FIG. 3 the substrate electrode 6 and the stripe electrode 7 are not shown. The light emitting mechanism of this device is the same as that of the conventional device except for the following points: That is, in this device the band gap of the active layer 13b grown on the ridge 8 is larger than that of the band gap of the active layer 13d inside the chip, whereby the light emitting end surface 13c becomes transparent to the light generated inside. The result is that the light is not absorbed. Accordingly, the light emitting end surface 13c is not likely to be destroyed by heat which is normally caused by the light absorption. Furthermore, the active layer 13b is thin at the neighbour of the light emitting end surface 13c, whereby the extrusion of light to the cladding layer 12, 14 becomes large. It results in a reduced light power density which is advantageous in view of a high power output. This is a secondary effect. Also in this method, the central portion 13d of the active layer 13 and the light emitting end surface portion 13b thereof are grown at the same time, whereby only a small number of defects are produced, resulting in an easy manufacturing.

In the above-illustrated embodiment a semiconductor laser of a simple structure is shown, but the present invention can be applied to various kinds of semiconductor lasers of mode-controlled structures which are widely used, and then high power output can be realized.

Figure 4:
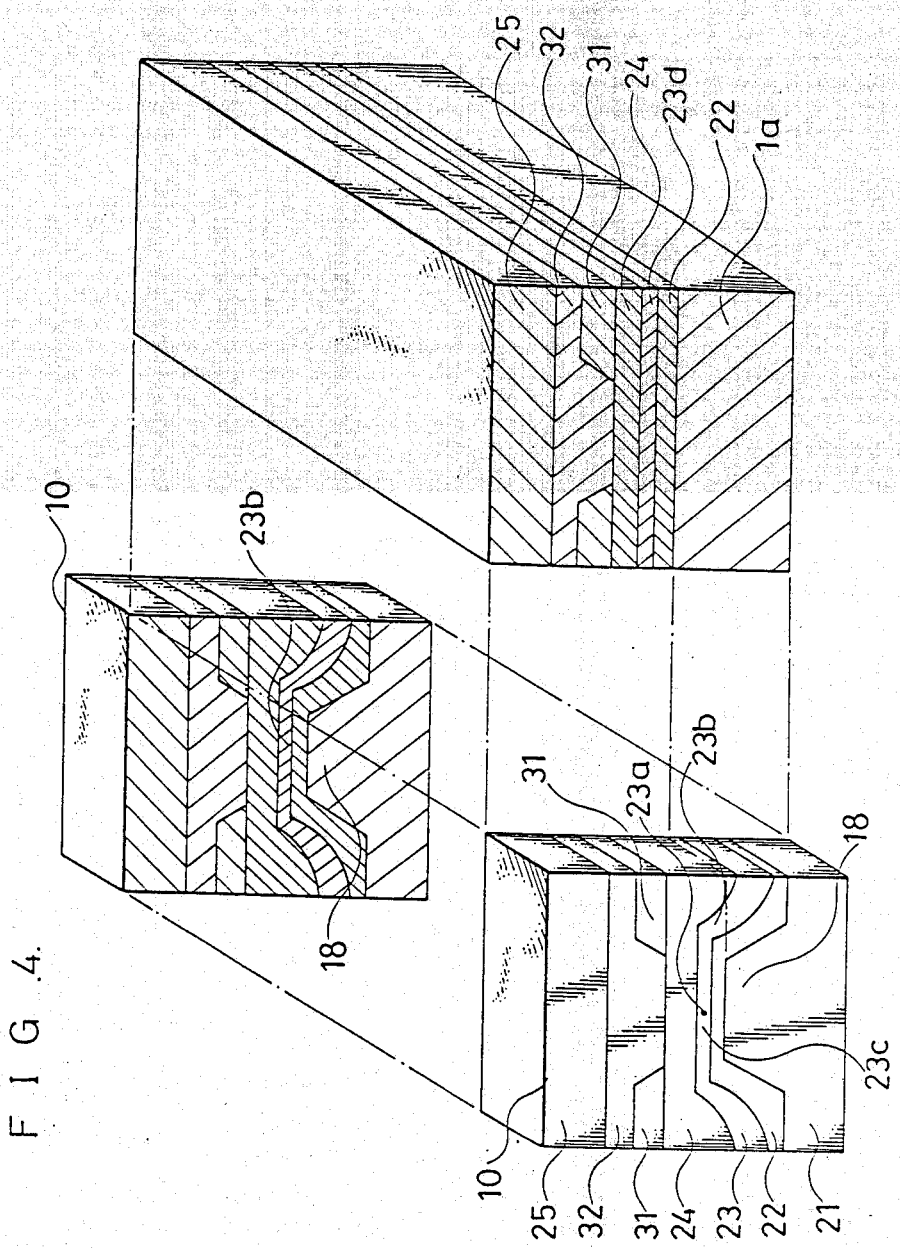
FIG. 4 shows a perspective view of a second embodiment of the present invention.

FIG. 4 shows a second embodiment of the present invention which has such a mode-controlled structure.

In FIG. 4, the reference numeral 18 designates a ridge having a cross-section of a mesa type configuration. The numeral 21 designates an n type GaAs substrate, and the numeral 22 designates an n type $Ga_{1-x}Al_xAs$ lower cladding layer. The numeral 23 designates an active layer, the numeral 23a designates a light emitting portion thereof, the numeral 23c designates a light emitting end surface thereof, the numeral 23b designates a portion of the active layer 23 in the neighborhood of the light emitting end surface 23c, and the numeral 23d designates a portion of the active layer 23 inside the chip away from the light-emitting end surface. The numeral 24 designates a p type $Ga_{1-x}Al_xAs$ first upper cladding layer, the numeral 32 designates a p type $Ga_{1-x}Al_xAs$ second upper cladding layer, and the numeral 25 designates a GaAs contact layer. The numeral 31 designates an n type $Ga_{1-z}Al_zAs$ current confining layer produced at each of the both sides of the laser resonator on the first upper cladding layer 24. A substrate electrode 6 and the stripe electrode 7 are also used but are not shown.

This second embodiment can have a CSP type light guide structure or a rib type light guide structure by regulating the thickness of the first upper cladding layer 24 and the aluminium composition proportion z of the current confining layer 31. In either case, it is not likely to give rise to an astigmatism in the laser light because the light guide layer is extended to the resonator end surface 10 even though a window structure is constructed in the neighborhood of the resonator end surface 10 according to the present invention.

Figure 5:
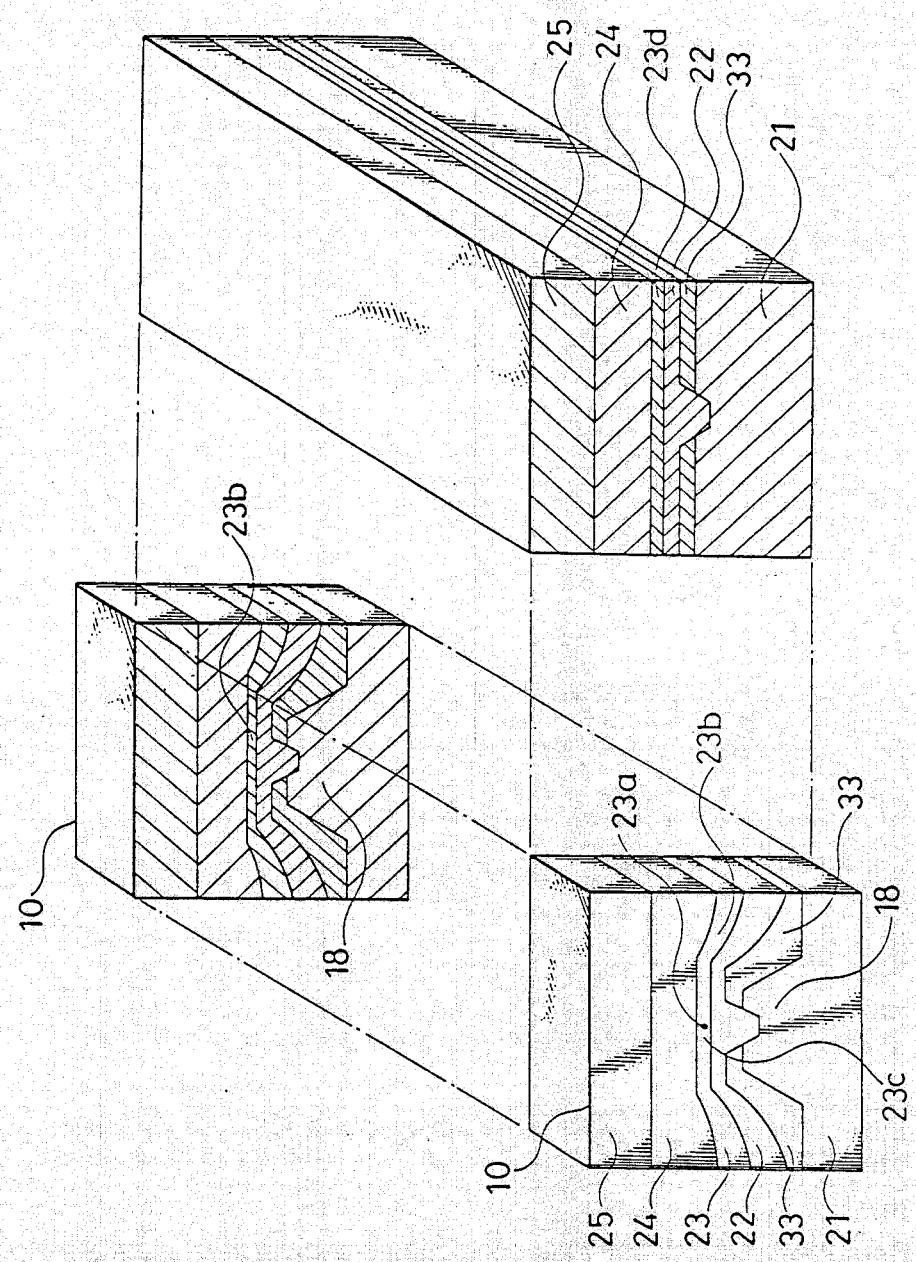
FIG. 5 shows a perspective view of a third embodiment of the present invention.

A third embodiment of the present invention is shown in FIG. 5, wherein the central portion of the device is relocated for illustration only. This device is different from that of FIG. 3 only in that the n type $Ga_{1-z}Al_zAs$ current confining layer 33 is removed to between the substrate 21 and the lower cladding layer 22. The operation and effects thereof are essentially the same as those of the device of FIG. 4.

In all of the above illustrated embodiments n type substrates are used, but p type substrates can be used simply by reversing the conductivity type of each layer produced thereon.

Figure 6:
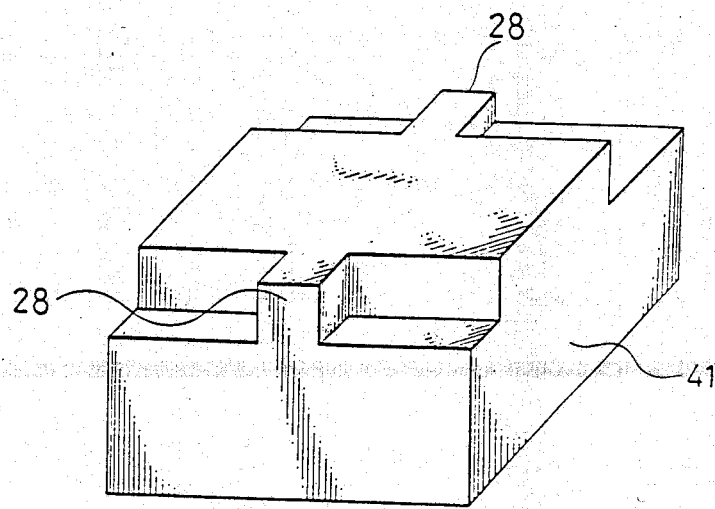
FIG. 6 shows a perspective view of another type substrate which can be used for producing a semiconductor laser according to the present invention.

In the first embodiment the cross-section of the ridge of the substrate is of a reverse mesa type configuration, and in the second and third embodiment the ridges are of mesa type configurations, but only the width and the height of the ridges are important, and either a reverse mesa or a mesa type configuration can be arbitrarily used. The substrate 41 shown in FIG. 6 which has a ridge 28 of a rectangular cross-section can also be used with same effects.

According to the present invention, the active layer is thinner and has a larger band gap in the neighborhood of the end surface of the resonator than at the inside of the resonator. Heat-caused-laser mirror-destruction of the light emitting end surface is not likely to occur, and a high power output is obtained.

What is claimed is:

1. A semiconductor laser, comprising:
   a semiconductor substrate of a first conductivity type having a ridge on a top surface thereof extending in a direction substantially parallel to a directon of a light guide of the laser, said ridge existing only in the neighborhood of a resonator end surface; and
   a lower cladding layer of said first conductivity type, an active layer, and an upper cladding layer of a second conductivity type, produced one after the other on said substrate in the above-mentioned order by a liquid phase growth process such that said active layer has a portion that is thinner above the ridge than a portion of the active layer that is inside the laser resonator removed from said resonator end surface.

2. A semiconductor laser as defined in claim 1, wherein the cross-section of the ridge in a plain parallel with said resonator end surface is of an inverse mesa type configuration.

3. A semiconductor laser as defined in claim 1, wherein the cross-section of the ridge in a plain parallel with the resonator end surface is of a mesa type configuration.

4. A semiconductor laser as defined in claim 1, wherein the cross-section of the ridge in a plain parallel with the resonator end surface is of a rectangular configuration.

5. A semiconductor laser as defined in claim 1, wherein the active layer extends to said resonator end surface.

6. A semiconductor laser as defined in claim 1, wherein the substrate comprises GaAs, and the active layer comprises $Ga_{1-y}Al_yAs$.

7. The semiconductor laser of claim 6 wherein said lower and upper cladding layer comprise $Ga_{1-x}Al_xAs$ and wherein $x>y$.

8. The semiconductor laser of claim 1, further comprising:
   a current confining layer disposed on said upper cladding layer; and
   a second upper cladding layer disposed on said current confining layer.

9. The semiconductor laser of claim 8 wherein said upper cladding layer is etched so that said current confining layer is also disposed above said active layer.

10. The semiconductor laser of claim 8 wherein said current confining layer comprises $Ga_{1-z}Al_zAs$ of said first conductivity type and said second upper cladding layer comprises $Ga_{1-x}Al_xAs$ of said second conductivity type.

11. A semiconductor laser as defined in claim 10, wherein said substrate comprises GaAs, and said active layer comprises $Ga_{1-y}Al_yAs$.

12. The semiconductor laser of claim 11, wherein said lower and upper cladding layer comprise $Ga_{1-x}Al_xAs$ and wherein $x>y$.

13. A semiconductor laser comprising:
   a semiconductor substrate of a first conductivity type having a ridge on a top surface thereof extending in a direction substantially parallel to a direction of a light guide of the laser, said ridge existing in the neighborhood of a resonator end surface; and
   a current confining layer, a lower cladding layer, an active layer and an upper cladding layer produced one after the other on said substrate in the abovementioned order by a liquid phase growth process such that said active layer has a portion that is thinner above the ridge than a portion of said active layer that is inside the resonator, removed from said resonator end surface.

* * * * *